(12) United States Patent
Doi et al.

(10) Patent No.: US 6,831,300 B2
(45) Date of Patent: Dec. 14, 2004

(54) SEMICONDUCTOR LIGHT EMITTING DEVICE, MANUFACTURING METHOD OF A SEMICONDUCTOR LIGHT EMITTING DEVICE AND CONNECTION STRUCTURE OF AN ELECTRODE LAYER

(75) Inventors: Masato Doi, Kanagawa (JP); Hiroyuki Okuyama, Kanagawa (JP); Goshi Biwa, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/258,157

(22) PCT Filed: Feb. 12, 2002

(86) PCT No.: PCT/JP02/01134

§ 371 (c)(1),
(2), (4) Date: May 7, 2003

(87) PCT Pub. No.: WO02/067340

PCT Pub. Date: Aug. 29, 2002

(65) Prior Publication Data

US 2003/0183824 A1 Oct. 2, 2003

(30) Foreign Application Priority Data

Feb. 21, 2001 (JP) .......................................... 2001-44832

(51) Int. Cl.[7] .............................................. H01L 29/22
(52) U.S. Cl. .............................. 257/79; 257/99; 438/22
(58) Field of Search ............................. 257/79, 81, 99; 438/22, 24

(56) References Cited

U.S. PATENT DOCUMENTS

| 5,177,405 | A | 1/1993 | Kusuda et al. |
|---|---|---|---|
| 5,727,008 | A | 3/1998 | Koga |
| 5,732,098 | A | 3/1998 | Nisitani et al. |
| 5,814,839 | A | 9/1998 | Hosoba |
| 5,828,088 | A | 10/1998 | Mauk |
| 5,981,977 | A | 11/1999 | Furukawa et al. |
| 6,252,255 | B1 | 6/2001 | Ueta et al. |
| 6,320,209 | B1 | 11/2001 | Hata et al. |
| 2003/0077847 | A1 * | 4/2003 | Yoo .............................. 438/22 |
| 2003/0146445 | A1 * | 8/2003 | Hen .............................. 257/93 |

FOREIGN PATENT DOCUMENTS

| JP | 56-92577 | 7/1981 |
|---|---|---|
| JP | 57-45583 | 3/1982 |
| JP | 57-52071 | 3/1982 |
| JP | 57-52072 | 3/1982 |
| JP | 57-52073 | 3/1982 |

(List continued on next page.)

OTHER PUBLICATIONS

Zheleva et al., *Pendeo–epitaxy–a new approach for lateral growth of gallium nitride structures*, MRS Internet J. Nitride Semicond. Res. 4S1, G3.38 (1999).

Kapolnek et al., *Spatial control of InGaN luminescence by MOCVD selective epitaxy*, Journal of Crystal Growth, 189/190 (1998) pp. 83–86.

(List continued on next page.)

*Primary Examiner*—Roy Potter
(74) *Attorney, Agent, or Firm*—Bell, Boyd & Lloyd LLC

(57) ABSTRACT

In a semiconductor light emitting device configured to extract light through a substrate thereof, an electrode layer is formed on a p-type semiconductor layer (such as p-type GaN layer) formed on an active layer, and a nickel layer is formed as a contact metal layer between the electrode layer and the p-type semiconductor layer and adjusted in thickness not to exceed the intrusion length of light generated in the active layer. Since the nickel layer is sufficiently thin, reflection efficiency can be enhanced.

14 Claims, 3 Drawing Sheets

FOREIGN PATENT DOCUMENTS

| | | |
|---|---|---|
| JP | 58-50577 | 3/1983 |
| JP | 61-156780 | 7/1986 |
| JP | 63-188938 | 8/1988 |
| JP | 02-263668 | 10/1990 |
| JP | 03-035568 | 2/1991 |
| JP | 5251738 | 9/1993 |
| JP | 06-045648 | 2/1994 |
| JP | 06-067044 | 3/1994 |
| JP | 6188450 | 7/1994 |
| JP | 07-199829 | 4/1995 |
| JP | 08-008217 | 1/1996 |
| JP | 8116093 | 5/1996 |
| JP | 08-255929 | 10/1996 |
| JP | 09-129974 | 5/1997 |
| JP | 9199419 | 7/1997 |
| JP | 09-199419 | 7/1997 |
| JP | 10-125929 | 5/1998 |
| JP | 10-265297 | 10/1998 |
| JP | 10-270801 | 10/1998 |
| JP | 10-312971 | 11/1998 |
| JP | 10-321910 | 12/1998 |
| JP | 11-026883 | 1/1999 |
| JP | 11-075019 | 3/1999 |
| JP | 11-177138 | 7/1999 |
| JP | 11-191641 | 7/1999 |
| JP | 11191641 | 7/1999 |
| JP | 11-238687 | 8/1999 |
| JP | 11-251253 | 9/1999 |
| JP | 11-274568 | 10/1999 |
| JP | 11-312840 | 11/1999 |
| JP | 11-514136 | 11/1999 |
| JP | 11-346004 | 12/1999 |
| JP | 2000-012976 | 1/2000 |
| JP | 2000-91638 | 3/2000 |
| JP | 2000-068593 | 3/2000 |
| JP | 2000-150391 | 5/2000 |
| JP | 2000-183451 | 6/2000 |
| JP | 2000-223417 | 8/2000 |
| JP | 2000-332343 | 11/2000 |
| JP | 2001-085738 | 3/2001 |
| JP | 2001-217503 | 8/2001 |
| JP | 11-220170 | 1/2002 |
| JP | 2002-185660 | 12/2002 |
| WO | WO 97/44612 | 11/1997 |

OTHER PUBLICATIONS

J. Wang et al., *Fabrication of nanoscale structures of InGaN by MOCVD lateral overgrowth*, Journal of Crystal Growth 197 (1999), pp. 48–53.

Raj Singh et al., *Selective Area Growth of GaN Directly on (0001) Sapphire by the HVPE Technique*, MRS Internet Journal Nitride Semiconductor Research, 3, 13 (1998), pp. 1–4.

Zhigang Mao, et al., *Defects in GaN Pyramids Grown on Si(lll) Substrates by Selective Lateral Overgrowth*, Materials Research Society Meeting in Boston, Mass. (1998), pp. 1–6.

Tachibani et al, *Selective growth of InGaN quantum dot structures and their microphotoluminescence at room temperature*, Applied Physics Letters, vol. 76, No. 22, May 29, 2000, pp. 3212–3214.

Yang et al., Single–crystal GaN pyramids grown on (1 1 1) Si substrates by selective lateral overgrowth, Journal of Crystal Growth, vol. 204, (1999), pp. 247–418.

* cited by examiner

CALCULATED REFLECTANCE VALUES OF GaN/Ni/Ag
(0 DEGREE INCIDENCE)

CALCULATED REFLECTANCE VALUES OF GaN/Ni/Al
(0 DEGREE INCIDENCE)

CALCULATED REFLECTANCE VALUES OF GaN/Ni/Au
(0 DEGREE INCIDENCE)

SEMICONDUCTOR LIGHT EMITTING DEVICE, MANUFACTURING METHOD OF A SEMICONDUCTOR LIGHT EMITTING DEVICE AND CONNECTION STRUCTURE OF AN ELECTRODE LAYER

TECHNICAL FIELD

This invention relates to a semiconductor light emitting device made by using nitride semiconductors or the like, its manufacturing method, and a connection structure of an electrode layer. More particularly, the invention relates to a semiconductor light emitting device of the type that reflects light generated in the active layer with an electrode layer deposited on the active layer, its manufacturing method, and a connection structure of the electrode layer.

BACKGROUND ART

Gallium nitride-family compound semiconductors are increasing their use as semiconductor materials for visible light emitting devices, and their development is progressing especially in the field-of blue and green light emitting diodes. Light emitting diodes, in general, have a structure of sequential deposition of n-type semiconductor layers, active layers and p-type semiconductor layers by crystal growth of gallium nitride-family compound semiconductor layers on a sapphire substrate, or the like. In case of a light emitting diode having this kind of multi-layered structure, electric current is introduced to the active layer, and light generated in the active layer is externally taken out.

In regard to semiconductor light emitting devices of this type, there are known structures configured to extract light traveling upward of the active layer and structures configured to extract light traveling downward of the active layer through a transparent substrate. Among such structures configured to extract light through a transparent substrate, there is a device having a structure using an electrode connected to a p-type semiconductor layer as a reflective layer. For example, a light emitting diode device disclosed in Japanese Patent Laid-Open Publication No. hei 11-191641, a light emitting diode device disclosed in Japanese Patent Laid-Open Publication No. hei 11-220170 and a semiconductor light emitting device disclosed in Japanese Patent Laid-Open Publication No. 2000-91638 are known among others.

In such devices configured to reflect light emitted in a semiconductor light emitting device at a p-side electrode interface, since light reflected by the p-side electrode interface is added to the light traveling through the substrate as the output light through the substrate, the emission efficiency of the light emitting devices can be enhanced. As to a device described in Japanese Patent Laid-Open Publication No. hei 11-191641 and a semiconductor light emitting device described in Japanese Patent Laid-Open Publication No. 2000-91638, there are disclosed structures forming a contact metal layer for ohmic contact between a p-type semiconductor layer and an electrode layer functional as a reflective layer.

However, even in case a contact layer is formed for the purpose of ensuring reliable contact with the p-side semiconductor layer, if the thickness of the contact layer is as thick as approximately 50 nm, for example, it is difficult to enhance the reflectance, and it needs improvement of the reflection structure itself, including the contact metal layer under the demand for higher and higher light emitting efficiency.

It is therefore an object of the invention to provide a semiconductor light emitting device and its manufacturing method capable of realizing higher emission efficiency and to provide a connection structure of an electrode layer capable of realizing higher efficiency.

DISCLOSURE OF INVENTION

A semiconductor light emitting device according to the invention including a semiconductor light emitting layer of a first conduction type, an active layer and a semiconductor layer of a second conduction type which are sequentially deposited on an optically transparent substrate, comprises: an electrode layer formed on the semiconductor layer of the second conduction type on the active layer, and a contact metal layer interposed between the electrode layer and the semiconductor layer of the second conduction type and adjusted in thickness not to exceed the intrusion length of light emitted generated in the active layer.

With the above-summarized semiconductor light emitting device, since the semiconductor layer of the first conduction type, active layer and semiconductor layer of the second conduction type are sequentially stacked, the active layer can generate light with a current injected therein. Since the substrate is optically transparent, the light generated in the active layer is radiated through the substrate, but part of the light generated in the active layer travels toward the semiconductor layer of the second conduction type. Since the electrode layer overlies the semiconductor layer of the second conduction type, their interface can reflect the light traveling toward this semiconductor layer. Thus the light traveling toward the semiconductor layer of the second conduction type is reflected toward the substrate. Since the contact metal layer is interposed between the electrode layer-and the semiconductor layer of the second conduction type and adjusted in thickness not to exceed the intrusion length of the generated light, reflectance by .the electrode layer can be enhanced while the ohmic contact is ensured, and the emission efficiency of the entire device can be enhanced accordingly.

A method of manufacturing a semiconductor light emitting device according to the invention comprises the steps of: sequentially depositing a semiconductor light emitting layer of a first conduction type, an active layer and a semiconductor layer of a second conduction type on an optically transparent substrate; forming a contact metal layer on the semiconductor layer of the second conduction type, which is adjusted in thickness not to exceed the intrusion length of light generated in the active layer; and forming an electrode layer on the contact metal layer.

In the above-summarized manufacturing method of a semiconductor light emitting device, the contact metal layer adjusted in thickness not to exceed the intrusion length of the light generated in the active layer after the semiconductor layer of the second conduction type is formed, and the electrode layer is formed after the contact metal layer having that thickness is formed. Therefore, the contact metal layer having the thickness not exceeding the intrusion length of the light generated in the active layer can enhance the reflectance by the electrode layer while the ohmic contact is ensured, and the intensity of reflection toward the optically transparent substrate can be enhanced accordingly.

A connection structure of an electrode layer according to the invention comprises: an optically transparent semiconductor layer; a contact metal layer formed on the semiconductor layer and adjusted in thickness not to exceed the intrusion length of light passing through the semiconductor layer; and an electrode layer formed on the contact metal layer. With this connection structure of the electrode layer, similarly to the semiconductor light emitting device, since the contact metal layer is interposed between the electrode layer and the semiconductor layer and adjusted in thickness not to exceed the intrusion length of the generated light, reflectance by the electrode layer can be enhanced while the ohmic contact is ensured.

BEST MODE FOR CARRYING OUT THE INVENTION

Embodiments of the invention are explained below with reference to the drawings.

First Embodiment

Figure 1:
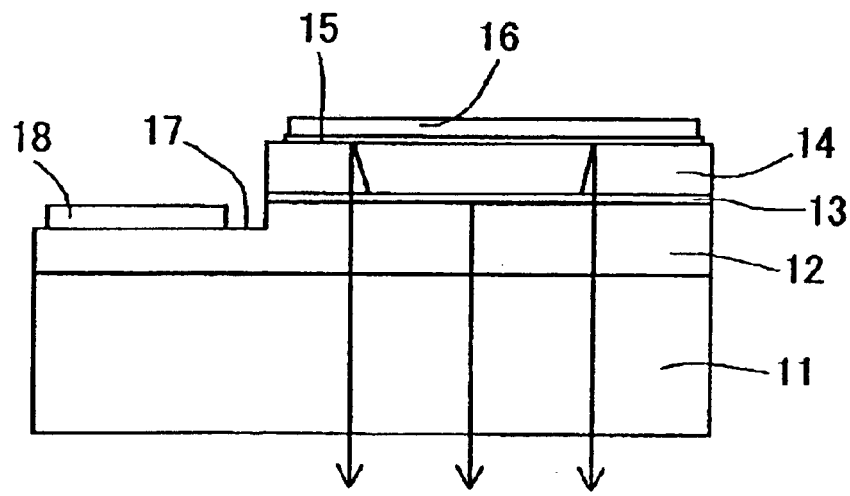
FIG. 1 is a cross-sectional view of a semiconductor light emitting device according to the first embodiment of the invention.

FIG. 1 is a cross-sectional view of a semiconductor light emitting device according to the instant embodiment of the invention. The semiconductor light emitting device according to the first embodiment includes a light emitting portion formed by stacking GaN compound semiconductors. Namely, on a insulating transparent sapphire substrate 11 via a GaN buffer layer, an n-type GaN layer 12 doped with silicon, InGaN active layer 13 for emitting light, and p-type GaN layer 14 doped with magnesium are stacked. The silicon-doped n-type GaN layer 12 functions as a cladding layer of the first conduction type, and the magnesium-doped p-type GaN layer 14 functions as the cladding layer of the second conduction type. Thus the device has a double-hetero structure.

On the p-type GaN layer 14 as the cladding layer of the second conduction type, a nickel layer 15 as a contact metal layer for ohmic contact is formed. Thickness of the nickel layer 15 is adjusted not to exceed the intrusion length of light generated in the active layer as explained later. In this embodiment, the thickness is approximately 10 nm, for example. Formed on the nickel layer 15 is a p-side electrode layer 16. The p-side electrode layer 16 is a thin film of aluminum or silver such that the light passing through the nickel layer 15 as the contact metal layer is reflected by the interface with the p-side electrode layer 16. Although the p-side electrode layer 16 used in this embodiment is a thin film of aluminum or silver, it may be a metal layer of gold or platinum on the aluminum or silver thin film.

The n-side electrode 18 is formed by first stacking the n-type GaN layer 12, InGaN active layer 13 and p-type GaN layer 14 on the entire surface, thereafter forming an n-side electrode extracting region 17 where the n-type GaN layer 12 is exposed by making an opening, so as to lie on the n-side electrode extracting region 17 for electrical connection with the n-type GaN layer 12. The n-side electrode layer 18 has a Ti/Al/Pt/Au electrode structure.

Figure 2:
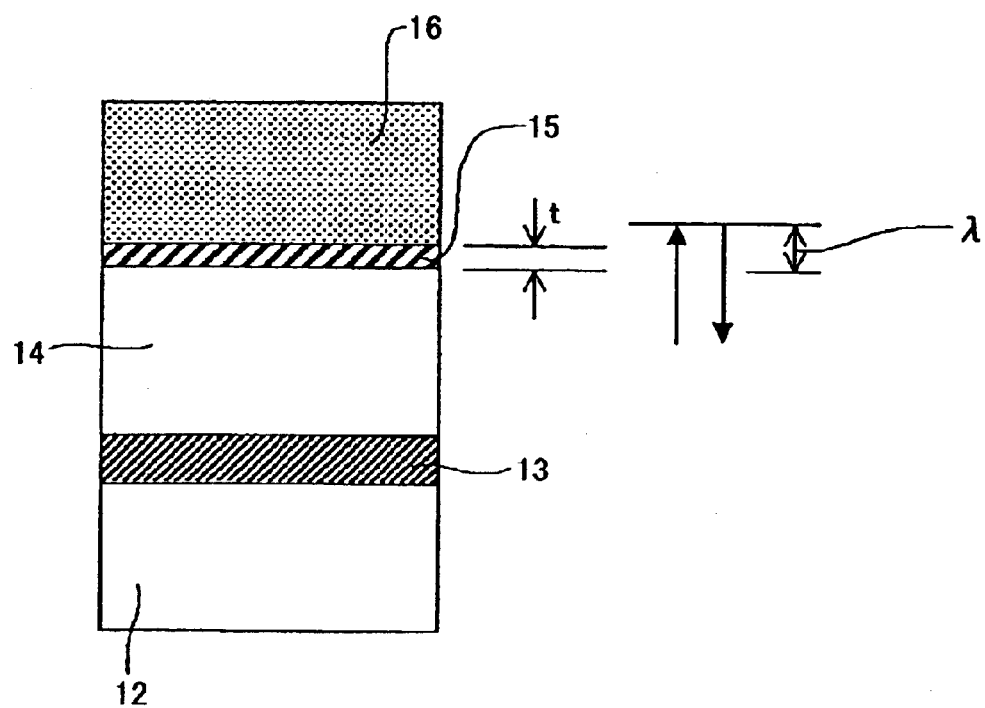
FIG. 2 is a cross-sectional view of the substantial part of the semiconductor light emitting device according to the first embodiment of the invention.

FIG. 2 is a cross-sectional view of the substantial part of the first embodiment of the invention. As shown in FIG. 2, the semiconductor light emitting device according to the instant embodiment has a double-hetero structure interposing an InGaN active layer 13 between the n-type GaN layer 12 and the p-type GaN layer 14 that are cladding layers. The nickel layer 15 as the contact metal layer for making ohmic contact is formed on the p-type GaN layer 14, and the p-side electrode layer 16 of aluminum or silver is formed on the nickel layer 15. Thickness t of the nickel layer 15 is adjusted not to exceed the intrusion length $\lambda$ of light generated in the active layer 13. The thickness is approximately 10 nm in this embodiment, but may be changed in accordance with light to be generated, or may be changed in accordance with the quality of the film upon being formed by vapor deposition or plating, for example. When light is reflected by a metal surface the light as a electromagnetic wave having an energy enters into the metal from its surface by the depth called intrusion length from the metal surface. In case of complete reflection, the light reflects while receiving the same energy by phonon interaction. On the other hand, ohmic contact can be attained even with an extremely thin film. Emitting operation has been confirmed even with a nickel layer 15 as extremely thin as 1 nm through an experiment by the Inventor. As such, when the thickness t of the nickel layer 15 is adjusted not to exceed the intrusion length $\lambda$ of light generated in the active layer 13, reflection efficiency of the overlying p-type GaN layer 14 can be enhanced.

Taking that into consideration, the thickness t of the nickel layer 15 is preferably not thicker than 20 nm, more preferably not thicker than 10 nm, and more preferably not thicker than 5 nm. Such ranges of the thickness t can be explained also from diagrams of FIGS. 3 through 5 that show relationships between thickness of the nickel layer and reflectance.

Figure 3:
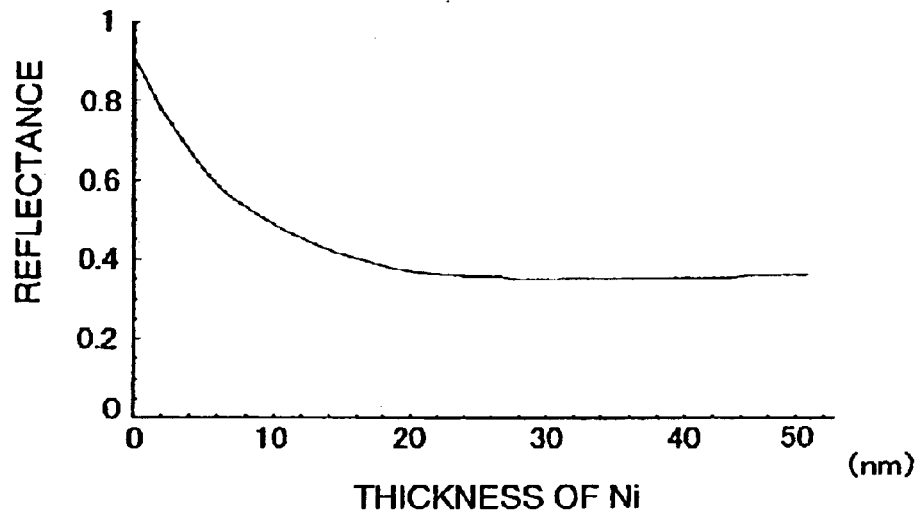
FIG. 3 is a characteristic diagram showing calculated dependency of reflectance of a GaN/Ni/Ag structure upon thickness of the Ni film.

FIG. 3 shows calculated values of reflectance obtained by reflecting- emitted light while changing thickness of the Ni layer in a multi-layered structure including GaN, Ni and Ag layers. As shown in FIG. 3, the reflectance is higher when the Ni layer is thin, and tends to decrease as the Ni layer becomes thicker. As shown in FIG. 3, in case the thickness exceeds 20 nm, the corresponding reflectance is 0.4 or less in absolute value. Therefore, in order to attain reflectance not less than 0.4, thickness of the Ni layer must be limited not to exceed 20 nm, and preferably, it is limited not to exceed 10 nm. If a reflectance of 0.6 or more is desirable, thickness of the Ni layer is preferably limited not to exceed 5 nm.

Figure 4:
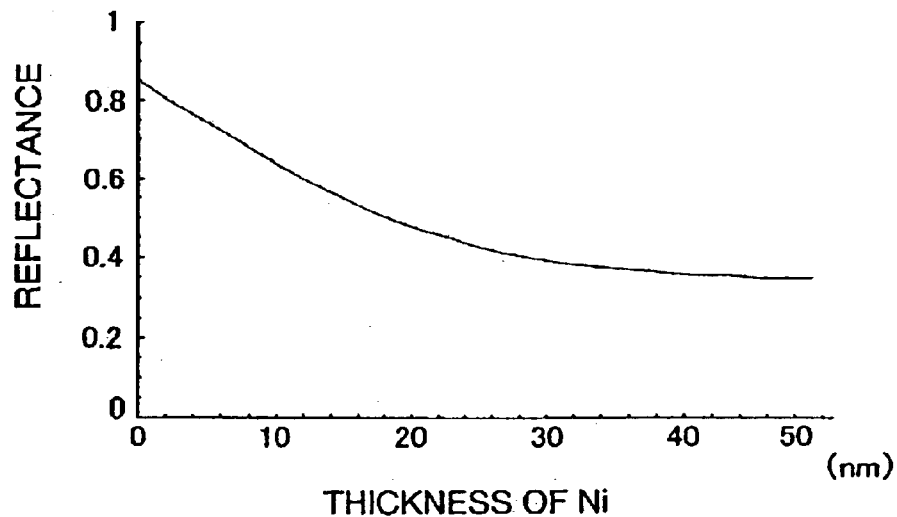
FIG. 4 is a characteristic diagram showing calculated dependency of reflectance of a GaN/Ni/Al structure upon thickness of the Ni film.

FIG. 4 shows calculated values of reflectance obtained by reflecting emitted light while changing thickness of the Ni layer in a multi-layered structure including GaN, Ni and Al layers. As shown in FIG. 3, the reflectance is higher when the Ni layer is thin, and tends to decrease as the Ni layer becomes thicker. As shown in FIG. 4, similarly to the structure including the Ag layer, in case the thickness exceeds 20 nm, the corresponding reflectance is 0.5 or less in absolute value. Therefore, in order to attain reflectance not less than 0.5, thickness of the Ni layer must be limited not to exceed 20 nm, and preferably, it is limited not to exceed 10 nm. The reflectance becomes 0.6 or more only when the thickness is 10 nm or less. More preferably, therefore, thickness of the Ni layer is preferably adjusted not to exceed 5 nm.

Figure 5:
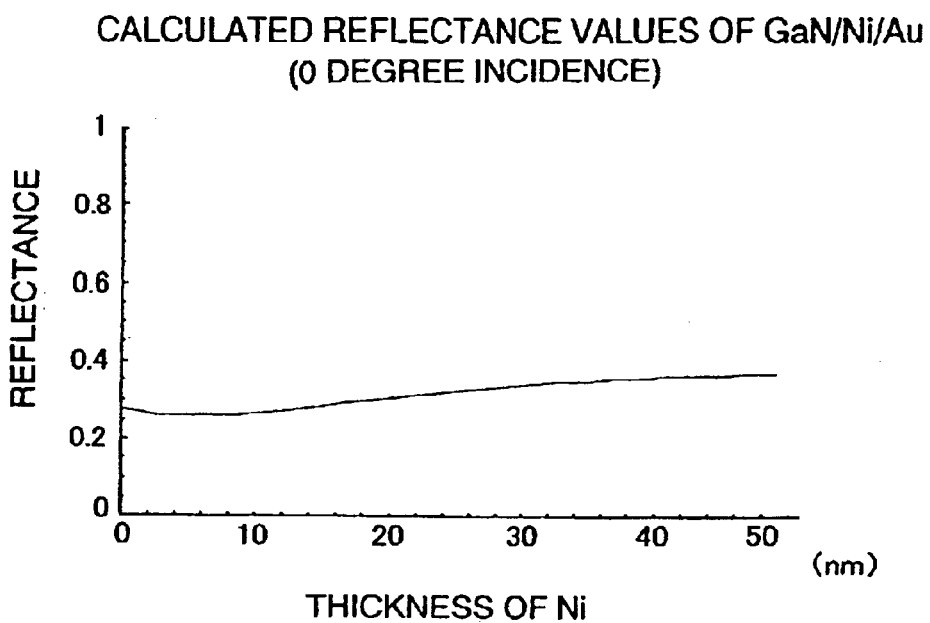
FIG. 5 is a characteristic diagram showing calculated dependency of reflectance of a GaN/Ni/Au structure upon thickness of the Ni film.

FIG. 5 is a diagram showing calculated values of reflectance of a multi-layered structure including GaN, Ni and Au layers. This structure using Au as the electrode layer does not exhibit the tendency of increasing reflectance even when the Ni layer is thinned. By comparison with FIG. 5, it is apparent that preferable metal material of the p-side electrode is Ag or Al.

As explained above, in the semiconductor light emitting device configured to extract light through the transparent sapphire substrate 11, since the light output from the InGaN active layer 13 is the sum of the light directly passing through the n-type GaN layer 12 and the sapphire substrate 11 and the light reflected back from the p-side electrode layer 16, and reflection efficiency of the light from the p-side electrode layer 16 is enhanced by thinning and optimizing the nickel layer 15 as the contact metal layer, emission efficiency of the device as a whole can be realized.

Although the foregoing embodiment has been explained as using the sapphire substrate as its substrate, other optically transparent substrates are also usable, such as gallium nitride substrate, glass substrate, transparent resin substrate, etc. It is also possible to use a substrate for mounting separately from a substrate by crystal growth by transfer, for example. The contact metal layer having explained as being Ni may be made of Pd, Co, Sb, or the like, or any of the alloys.

Second Embodiment

Figure 6:
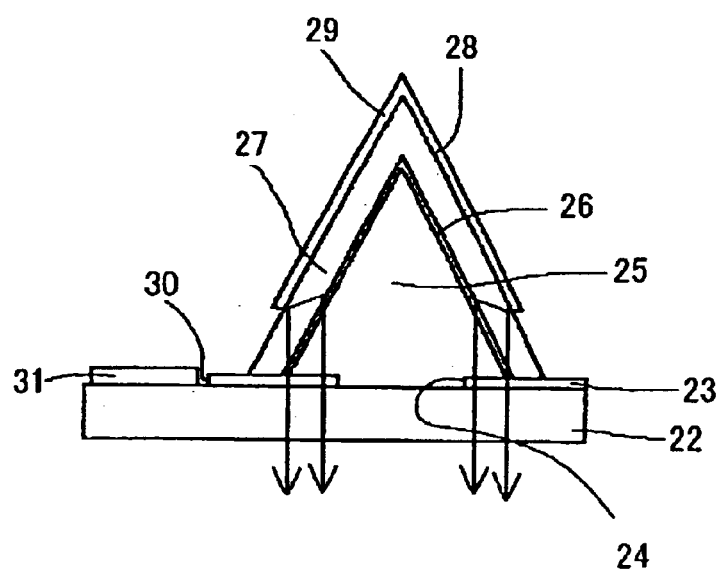
FIG. 6 is a cross-sectional view of a semiconductor light emitting device formed by selective growth according to the second embodiment of the invention.

This embodiment is directed to a semiconductor light emitting device having a six-sided-pyramidal crystal portion by selective growth. As shown in FIG. 6, the semiconductor light emitting device has the structure having a growth-inhibiting film 23 in form of a silicon oxide film, for example, formed on a base growth layer 22, and an n-type GaN layer 25 formed by selective growth from a window 24 made by partly opening the growth-inhibiting film 23. The base growth layer 22 is a layer grown to stack on a sapphire substrate having a c-oriented major surface via a buffer layer, and separated from the sapphire substrate by laser abrasion between the sapphire substrate and the base growth layer 22 by laser irradiation from beyond the bottom surface of the sapphire substrate.

Selective growth shapes the n-type GaN layer 25 grown from the base growth layer 22 into a six-sided pyramid or a quadrangular pyramid, and S-oriented slanted planes surround its perimeters. An InGaN active layer 26 is formed on the n-type GaN layer 25, and a magnesium-doped p-type GaN layer 27 is further stacked thereon. The n-type GaN layer 25 functions as the cladding layer of the first conduction type, and the p-type GaN layer 27 functions as the cladding layer of the second conduction type. Thus the semiconductor light emitting device according to the instant embodiment has a double-hetero structure.

On the semiconductor multi-layered structure, a nickel layer 28 is formed as the contact metal layer so as to cover the slanted surfaces, and a p-side electrode layer 29 is made of a metal material such as Ag or Al on the nickel layer 28. The nickel layer shown with a line in FIG. 6 is a thin film for the purpose of ohmic contact. Thickness of the nickel layer 28 is adjusted not to exceed the intrusion length of light generated in the active layer. It is approximately 10 nm, for example, in this embodiment. The p-side electrode layer 29 overlying the nickel layer 28 is used for reflecting light passing through the nickel layer 28 at the interface of the p-side electrode layer 29. Especially in this embodiment, the p-side electrode layer 29 enclose the InGaN active layer 26 in a self-aligned manner to form a structure like a reflector having its center at the apex of the six-sided pyramid such that light can be efficiently extracted while being multiply reflected. Therefore, by adjusting the thickness of the nickel layer 28 not to exceed the intrusion length of light generated in the InGaN active layer 26, it is possible to enhance the reflectance at the reflective surfaces and to increase the throughput of light. An experiment by the Inventors gave data that this structure with the nickel layer 28 controlled in thickness not to exceed the intrusion length of light exhibits emission efficiency as high as approximately 1.7 times that of a structures not controlled in thickness of the nickel layer 28.

Part of the base growth layer 22 is horizontally extended longer than the bottom of the n-type GaN layer 25. On the extended portion of the layer 25, the growth-inhibiting film 23 is partly removed to form an opening 30, and an n-side electrode layer 31 is formed inside the opening 30. The n-side electrode layer 31 has a Ti/Al/Pt/Au electrode structure, for example.

In the above-explained embodiment, the p-side electrode layer 16 is a thin film of aluminum or silver, for example, but it may have a structure including a metal layer of gold, platinum, or the like, stacked on an aluminum or silver layer.

In the semiconductor light emitting device according to the embodiment having that structure, since the light output from the InGaN active layer 26 is the sum of the light directly passing through the n-type GaN layer 25 and the base growth layer 22 and the light reflected back from the p-side electrode layer 29, and reflection efficiency of the light from the p-side electrode layer 29 is enhanced by thinning and optimizing the nickel layer 28 as the contact metal layer, emission efficiency of the device as a whole can be realized. Moreover, in the semiconductor light emitting device according to this embodiment, since the six-sided-pyramidal crystal structure is obtained by selective growth and the p-side electrode layer 29 formed in self alignment on the slanted surfaces of S-oriented planes, for example, of the GaN layer functions as a reflective film causing multiplex reflection, still higher reflectance can be realized.

Although the foregoing embodiment has been explained, taking an application of the structure of the electrode layer of the semiconductor light emitting device according to the invention to the light emitting diode, the invention is applicable also to semiconductor lasers and other optical semiconductor devices. Although the semiconductor light emitting devices according to the invention are not limited in emission wavelength, in case of a device for emitting blue light, the p-side electrode layer is preferably made of Ag or Al. Additionally, the contact metal layer having explained as being made of Ni may be made of Pd, Co or Sb, or any of their alloys instead.

As described above, according to the semiconductor light emitting device of the invention, since the light extracted through the transparent substrate is the sum of the light directly passing through the n-type GaN layer from the active layer and the light reflected back from the p-side electrode layer, and reflection efficiency of the light from the p-side electrode layer is enhanced by thinning and optimizing the contact metal layer, emission efficiency of the device as a whole can be easily realized.

Further, in case the semiconductor layers are formed by selective growth, since a pyramidal crystal structure in form of a six-sides pyramid, for example, can be obtained, and the p-side electrode layer formed in self alignment on the slanted surfaces of s-oriented planes, for example, of the GaN layer functions as a reflective film causing multiplex reflection, still higher reflectance can be realized.

What is claimed is:

1. A semiconductor light emitting device including a semiconductor light emitting layer of a first conduction type, an active layer and a semiconductor layer of a second conduction type which are sequentially deposited on an optically transparent substrate, comprising: an electrode layer formed on said semiconductor layer of the second conduction type on said active layer, and a contact metal layer interposed between said electrode layer and said semiconductor layer of the second conduction type and adjusted in thickness not to exceed the intrusion length of light emitted generated in said active layer.

2. The semiconductor light emitting device according to claim 1 wherein said semiconductor layer of the first conduction type, said active layer and said semiconductor layer of the second conduction type are nitride compound semiconductor layers.

3. The semiconductor light emitting device according to claim 1 wherein said semiconductor layer of the first conduction type, said active layer and said semiconductor layer of the second conduction type are selective growth layers formed by selective growth, respectively.

4. The semiconductor light emitting device according to claim 3 wherein said selective growth layers are grown in form of a six-sided pyramid, and said contact metal layer and said electrode layer are formed on slanted perimeter surfaces of the six-sided pyramid.

5. The semiconductor light emitting device according to claim 1 wherein said optically transparent substrate is one of a sapphire substrate, a gallium nitride substrate, a glass substrate and a transparent resin electrode.

6. The semiconductor light emitting device according to claim 1 wherein said contact metal layer is made of a material capable of ohmic contact with said semiconductor layer of the second conduction type.

7. The semiconductor light emitting device according to claim 4 wherein said contact metal layer is made of Ni, Pd, Co or Sb.

8. The semiconductor light emitting device according to claim 1 wherein said contact metal layer is adjusted in thickness not to exceed 20 nm.

9. The semiconductor light emitting device according to claim 1 wherein said contact metal layer is adjusted in thickness not to exceed 10 nm.

10. The semiconductor light emitting device according to claim 1 wherein said contact metal layer is adjusted in thickness not to exceed 5 nm.

11. The semiconductor light emitting device according to claim 1 wherein said semiconductor layer of the second conduction type functions to reflect light generated in said active layer.

12. The semiconductor light emitting device according to claim 1 wherein said electrode layer is made of Ag, Al, or a combination of a layer of Ag or Al with another metal layer.

13. A method of manufacturing a semiconductor light emitting device comprising the steps of:

sequentially depositing a semiconductor light emitting layer of a first conduction type, an active layer and a semiconductor layer of a second conduction type on an optically transparent substrate;

forming a contact metal layer on said semiconductor layer of the second conduction type, which is adjusted in thickness not to exceed the intrusion length of light generated in said active layer; and forming an electrode layer on said contact metal layer.

14. A connection structure of an electrode layer comprising:

an optically transparent semiconductor layer;

a contact metal layer formed on said semiconductor layer and adjusted in thickness not to exceed the intrusion length of light passing through said semiconductor layer; and an electrode layer formed on said contact metal layer.

* * * * *